United States Patent
Yamazaki

[11] Patent Number: 5,880,516
[45] Date of Patent: *Mar. 9, 1999

[54] SEMICONDUCTOR DEVICE UTILIZING A PEDESTAL COLLECTOR REGION AND METHOD OF MANUFACTURING THE SAME

[75] Inventor: Toru Yamazaki, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 705,857

[22] Filed: Aug. 28, 1996

[30] Foreign Application Priority Data

Aug. 31, 1995 [JP] Japan .................................. 7-246927

[51] Int. Cl.$^6$ .......................... H01L 29/00; H01L 27/82; H01L 27/102; H01L 29/70
[52] U.S. Cl. .......................... 257/558; 257/559; 257/583; 257/592
[58] Field of Search .................................. 257/558, 559, 257/583, 591, 592

[56] References Cited

U.S. PATENT DOCUMENTS

| | | |
|---|---|---|
| 4,165,516 | 8/1979 | Smulders . |
| 4,392,149 | 7/1983 | Horng et al. . |
| 4,996,581 | 2/1991 | Hamasaki . |
| 5,432,104 | 7/1995 | Sato . |
| 5,525,833 | 6/1996 | Jang ........................................ 257/587 |
| 5,548,158 | 8/1996 | Bulucea et al. ........................ 257/592 |
| 5,581,115 | 12/1996 | Grubisich et al. ..................... 257/592 |

FOREIGN PATENT DOCUMENTS

| | | |
|---|---|---|
| 0263504 | 4/1988 | European Pat. Off. . |
| 0425242 | 5/1991 | European Pat. Off. . |
| 0418421 | 3/1994 | European Pat. Off. . |
| 1-253272 | 10/1989 | Japan . |
| 4-051526 | 2/1992 | Japan . |
| 5-259175 | 10/1993 | Japan . |

OTHER PUBLICATIONS

IBM Technical Disclosure Bulletin, vol. 26, No. 2, Jul. 1983, Dumke.

*Primary Examiner*—Ngân V. Ngô
*Attorney, Agent, or Firm*—Sughrue, Mion, MacPeak & Seas, PLLC

[57] ABSTRACT

A semiconductor device having an epitaxial layer of one conductivity type formed on a semiconductor substrate of the other conductivity type, a base region of the other conductivity type formed on the epitaxial layer to extend from a surface of the epitaxial layer to a predetermined depth, the base region including an intrinsic base region and an external base region, an emitter region of the one conductivity type formed in the intrinsic base region, and a pedestal collector region of the one conductivity type formed in a portion of the epitaxial layer which is immediately under the base region to correspond thereto, wherein the pedestal collector region comprises a plurality of layers of pedestal collector regions which have an impurity concentration that changes in a direction of depth of the substrate and which are sequentially arranged in the direction of depth of the substrate.

22 Claims, 15 Drawing Sheets

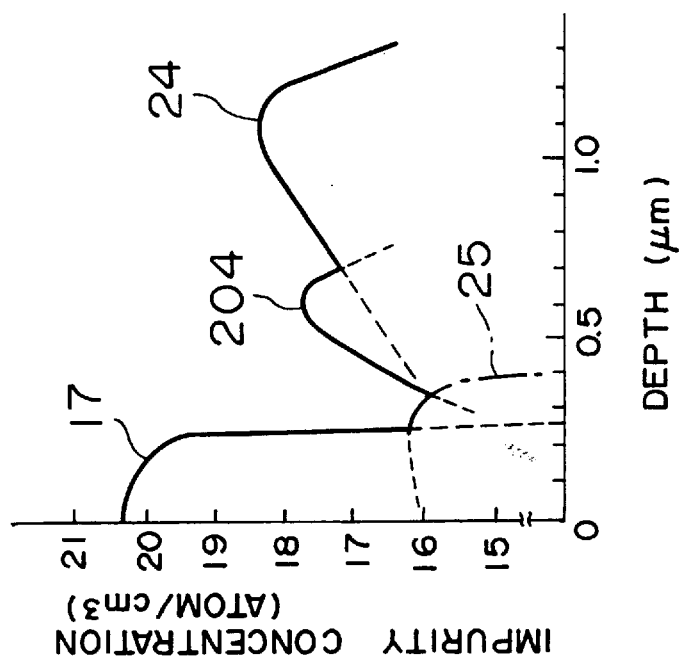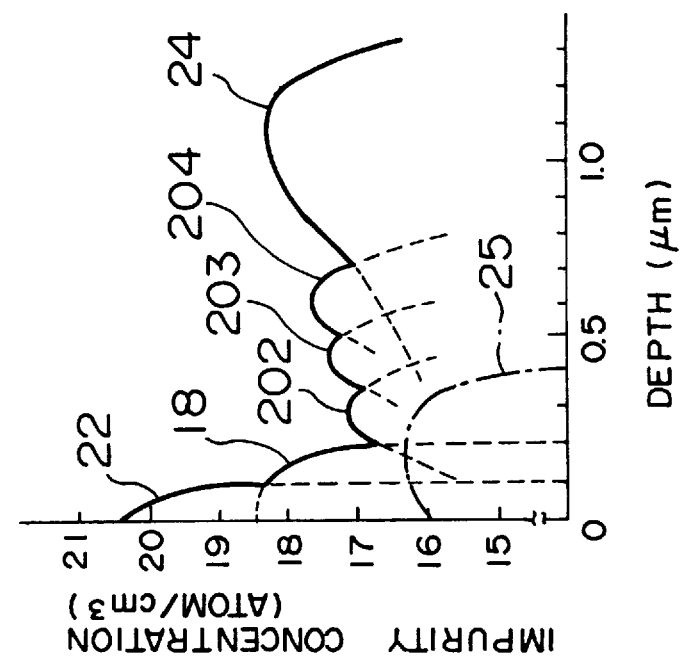

SEMICONDUCTOR DEVICE UTILIZING A PEDESTAL COLLECTOR REGION AND METHOD OF MANUFACTURING THE SAME

BACKGROUND OF THE INVENTION

1. Field of the Invention

The present invention relates to a semiconductor device and, more particularly, to a semiconductor device which includes a bipolar transistor, is capable of suppressing the Kirk effect and is also capable of a high-speed operation, and a method of manufacturing the same.

2. Description of the Prior Art

In order to obtain a high-speed switching performance in a bipolar transistor, the maximum oscillating frequency (to be abbreviated as fmax hereinafter) as one of performance indices must be increased. This fmax is given by the following equation:

$$fmax = (fT/8\pi \cdot Rb \cdot C_{BC})^{1/2}$$

where fT is the cut-off frequency, Rb is the base resistance, and $C_{BC}$ is the base-collector capacitance. It is apparent from the above equation that, in order to increase fmax, the cut-off frequency fT must be increased, the base-collector capacitance $C_{BC}$ must be decreased, and the base resistance Rb must be decreased. In recent years, in order to improve fmax to thereby improve the performance of the bipolar transistor, it has become more and more important to further increase the cut-off frequency and to decrease the base-collector junction capacitance or at least to minimize any increases in this capacitance.

Conventionally, in order to increase the cut-off frequency fT, scaling in the vertical direction, in particular in the direction of thickness of the base layer, has been performed. In order to decrease the base-collector capacitance and the base resistance, scaling in the planar direction has been performed by using a self alignment type bipolar transistor structure as shown in FIG. 1. Referring to FIG. 1, for example, reference numeral 111 denotes a p-type silicon substrate; 112, an n-type buried collector layer; 113, an n-type epitaxial layer; 114, 119, and 120, insulating films, e.g., silicon oxide films; 116, a base contact polycrystalline silicon layer; 117, a p-type external base diffusion layer; 118, a p-type intrinsic base; 115, a collector contact diffusion layer; 121, an emitter polycrystalline silicon layer; and 122, an n-type emitter diffusion layer, respectively.

As is generally known well, during a high-current injection operation the effective base width of a bipolar transistor increases in accordance with an increase in injection current. This is the so-called Kirk effect which is a major factor that degrades the high-speed operating performance. It is, therefore, important to decrease this Kirk effect. Conventionally, many methods of forming a pedestal collector region have been proposed in order to suppress the Kirk effect. For example, as shown in FIG. 2A, an n-type impurity is ion-implanted at a high concentration through an emitter-base forming opening portion 200 formed between a base contact electrode 216 and an insulating film 219, thus forming a pedestal collector region 201.

However, with this technique for suppressing the Kirk effect by forming a region doped with an impurity at a relatively high concentration immediately under the base-collector junction, since the base-collector junction capacitance increases, the transistor operation speed in the low-current injection decreases inversely. Also, the resistance of a region extending from the internal base to the external base, i.e., a so-called link base region, increases. These problems largely degrade the high-frequency characteristics of the transistor, as described above.

In order to solve these problems, as shown in FIG. 2B, there has been proposed a technique for forming a side wall 220 made of an insulating film on the side wall of an opening portion 200, and ion-implanting an n-type impurity at a high concentration through the opening portion 200, so that an n-type pedestal collector region 201 is selectively formed under an intrinsic base 218 immediately beneath the emitter region. As shown in FIG. 2C, Japanese Unexamined Patent Publication No. 5-259175 proposes a technique for forming a conductive layer 221 forming part of the emitter electrode in the emitter forming opening portion, and ion-implanting an n-type impurity at a high concentration to form a pedestal collector region 201. In this technique, the area of the pedestal collector region can be further decreased by self alignment, so that the base-collector parasitic capacitance can be decreased.

However, in each of the semiconductor devices shown in FIGS. 2B and 2C, although the base-collector parasitic capacitance can be decreased, the Kirk effect cannot be suppressed completely. This is due to the following reason. When the collector current increases, this collector current causes a so-called emitter clouding phenomenon (refer to reference symbol E in FIG. 2D) and mainly flows around the emitter diffusion layer. This emitter clouding phenomenon is described in, e.g., OHTA Kuni-icnhi, "Introduction to VLSI", Ohm Sha, pp. 30 to 31. If the pedestal collector region is formed immediately under an emitter diffusion layer 222 or on only a region narrower than the emitter diffusion layer 222, as described above, the Kirk effect occurs at the end portion of the emitter diffusion layer 222, as shown in FIG. 2D. Then, when a high-current injection operation is started, the cut-off frequency immediately decreases despite the presence of the pedestal collector region 201.

SUMMARY OF THE INVENTION

The present invention has been made in view of the above situation of the conventional technique, and has as its object to provide a semiconductor device which includes a bipolar transistor, and is capable of greatly improving the operation speed in a low-current injection region to a high-current injection while suppressing the Kirk effect, thus realizing a decrease in base resistance and base-collector junction capacitance, and a method of manufacturing the same.

In order to achieve the above object, according to the first aspect of the present invention, there is provided a semiconductor device comprising an epitaxial layer of one conductivity type formed on a semiconductor substrate of the other conductivity type, a base region of the other conductivity type formed on the epitaxial layer to extend from a surface of the epitaxial layer to a predetermined depth, the base region including an intrinsic base region and an external base region, an emitter region of the one conductivity type formed in the intrinsic base region, and a pedestal collector region of the one conductivity type formed in a portion of the epitaxial layer which is immediately under the base region to correspond thereto, wherein the pedestal collector region comprises a plurality of layers of pedestal collector regions which have an impurity concentration that changes in a direction of depth of the substrate and which are sequentially arranged in the direction of depth of the substrate.

The pedestal collector region of the first aspect comprises a first pedestal collector region formed at a deepest portion in the epitaxial layer, having a highest impurity concentration, and extending for a comparatively wide range, a second pedestal collector region formed at a position in the epitaxial layer which is shallower than the first pedestal collector region, having an impurity concentration lower than that of the first pedestal collector region, and extending for a range smaller than that of the first pedestal collector region, and a third pedestal collector region formed at a position in the epitaxial layer which is shallower than the second pedestal collector region, having an impurity concentration lower than that of the second pedestal collector region, and extending for a range smaller than that of the second pedestal collector region.

The semiconductor device can further comprise a region of the other conductivity type which is formed on a portion of the epitaxial layer immediately under the base region to correspond thereto so as to be in contact with the base region and which has an impurity concentration lower than that of the base region.

The semiconductor device can further comprise a collector buried layer formed under the epitaxial layer and a collector contact diffusion layer formed in the epitaxial layer to be in contact with the collector buried layer, wherein the first pedestal collector region is in contact with the collector contact diffusion layer with part of a periphery thereof.

According to the second aspect of the present invention, there is provided a method of manufacturing a semiconductor device, comprising the steps of forming an epitaxial layer of one conductivity type on a semiconductor substrate of the other conductivity type, doping an impurity of the one conductivity type to a prospective transistor formation region from a surface of the epitaxial layer to have a first depth and for a predetermined height, thus forming a first pedestal collector region, growing a polycrystalline silicon film of the one conductivity type on the substrate, using part of the polycrystalline silicon film as a base contact electrode and forming an emitter opening portion in part of the base contact electrode, doping an impurity of the other conductivity type to the substrate through the emitter opening portion, thus forming an intrinsic base region, doping an impurity of the one conductivity type from the surface of the epitaxial layer through the emitter opening portion to have a second depth shallower than the first depth and for a predetermined height, thus forming a second pedestal collector region, forming a side wall comprising an insulating film at least on an inner surface of the emitter opening portion, doping an impurity of the one conductivity type from the surface of the epitaxial layer through the emitter opening portion to have a third depth shallower than the second depth and for a predetermined height, thus forming a third pedestal collector region, and doping an impurity of the one conductivity type to the intrinsic base region, thus forming an emitter region.

The method according to the second aspect can further comprise, after the step of forming the first pedestal collector region and before the step of forming the base region, the step of removing the insulating film from the surface of the epitaxial layer, and the step of doping an impurity of the other conductivity type in accordance with ion implantation at an implantation angle of 0°, thus forming a low-concentration layer of the other conductivity type in the vicinity of the surface of the epitaxial layer.

According to the present invention having the respective aspects described above, the pedestal collector region formed immediately underneath the base region of the bipolar transistor is constituted by a plurality of layers of pedestal collector regions which have an impurity concentration that changes in a direction of depth of the substrate and which are sequentially arranged in the direction of depth of the substrate. Consequently, suppression of an increase in base resistance and base-collector junction capacitance can be realized simultaneously while suppressing the Kirk effect, so that the operation speed of the bipolar transistor can be greatly improved in the low-current injection region to the high-current injection region.

The above and many other advantages, features and additional objects of the present invention will become manifest to those versed in the art upon making reference to the following detailed description and accompanying drawings in which preferred embodiments incorporating the principles of the present invention are shown by way of illustrative example.

BRIEF DESCRIPTION OF THE DRAWINGS

FIGS. 10A and 10B are graphs showing the impurity concentration distribution of a pedestal collector region respectively taken along lines XA—XA and XB—XB in FIG. 8;

DETAILED DESCRIPTION OF THE PREFERRED EMBODIMENTS

Figure 1:
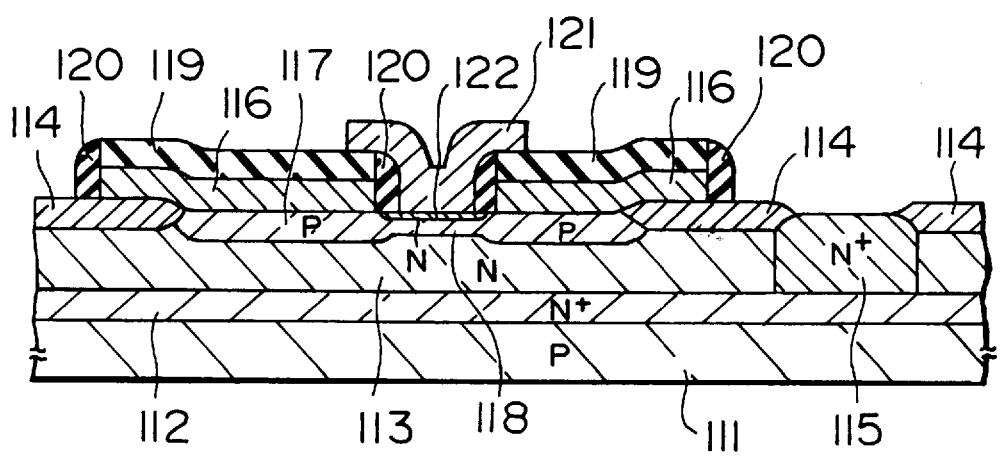
FIG. 1 is a longitudinal sectional view showing a conventional semiconductor device having a self alignment type bipolar transistor structure.
Figure 2A:
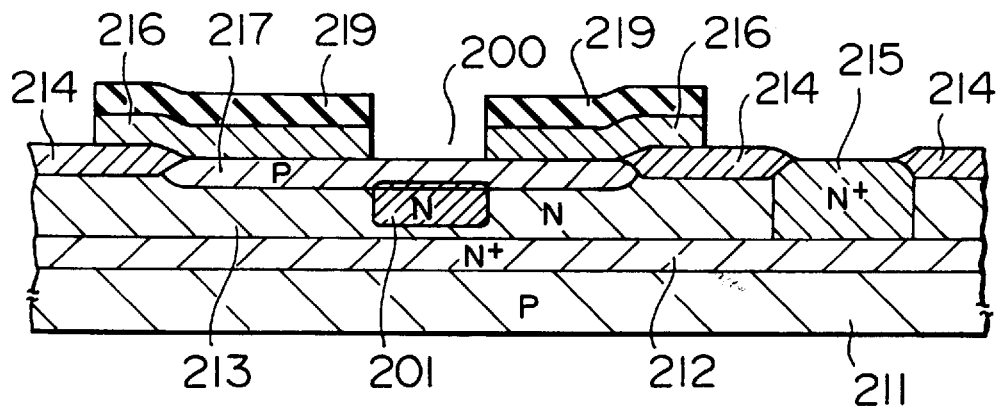
FIGS. 2A to 2C are longitudinal sectional views respectively showing different conventional semiconductor devices in each of which a pedestal collector region is formed in an epitaxial layer.
Figure 2B:
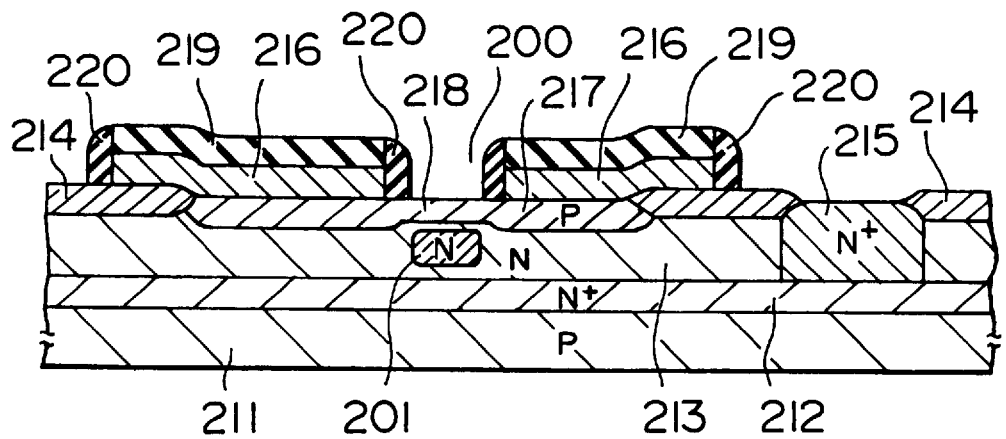
Figure 2C:
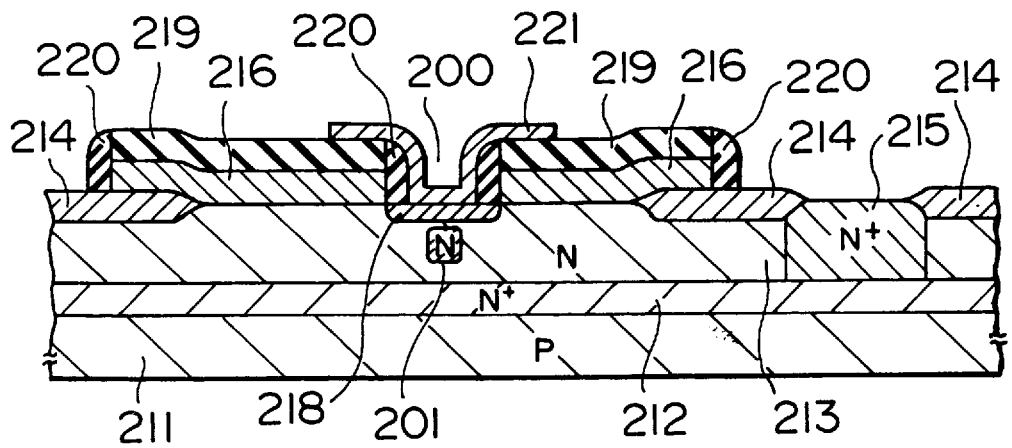
Figure 2D:
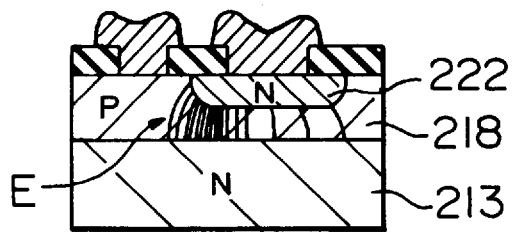
FIG. 2D is a view for explaining the drawbacks of the semiconductor devices shown in FIGS. 2B and 2C.
Figure 3:
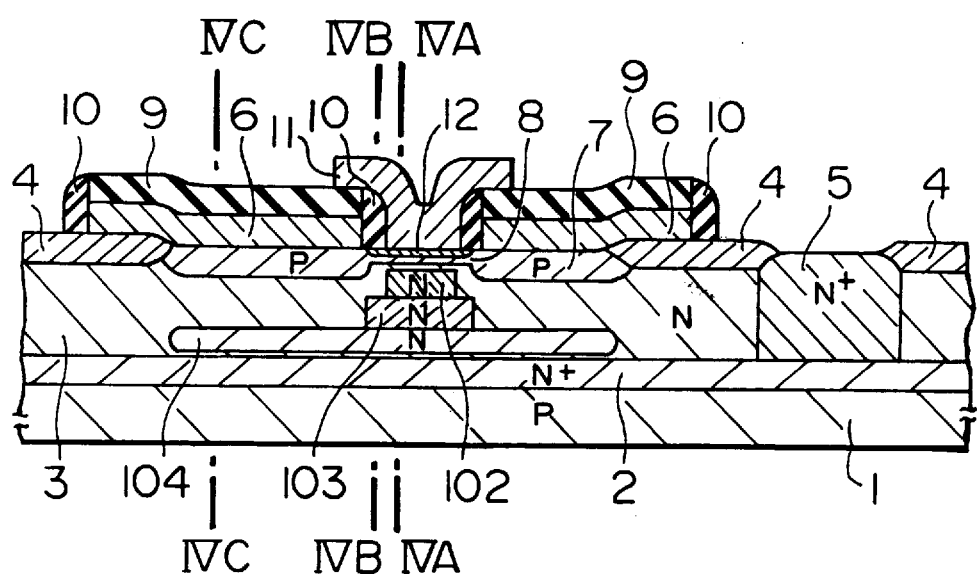
FIG. 3 is a longitudinal sectional view showing the first embodiment of the present invention.

Several preferred embodiments of the present invention will be described with reference to the accompanying drawings. FIG. 3 is a sectional view showing the first embodiment of the present invention. Referring to FIG. 3, an n-type buried layer 2 and an n-type epitaxial layer 3 are sequentially formed on a p-type semiconductor substrate 1. An isolation oxide film 4 is selectively formed on the surface portion of the n-type epitaxial layer 3. An n-type collector contact diffusion layer 5 is formed in a predetermined region of the n-type epitaxial layer 3 to reach the n-type buried layer 2. An p-type intrinsic base region 8 is formed on a predetermined portion of the n-type epitaxial layer 3, and an emitter region 12 is formed in the p-type intrinsic base region 8. A p-type external base region 7 is formed on the surface portion of the n-type epitaxial layer 3 on the two sides of the p-type intrinsic base region 8.

A base contact electrode 6 of p-type polycrystalline silicon for connection with the p-type intrinsic base region 8 is formed on the p-type external base region 7. An insulating interlayer film 9 consisting of a nitride film and a side wall insulating film 10 are formed to cover the base contact electrode 6, and an emitter electrode 11 for connection with an emitter region 12 is formed on the side wall insulating film 10. First, second, and third n-type pedestal collector regions 102, 103, and 104 are sequentially formed in the n-type epitaxial layer 3 immediately below the emitter region 12 such that their impurity concentration changes and their regions increase from the surface of the n-type epitaxial layer 3 toward the inner portion of the substrate.

Figure 4A:
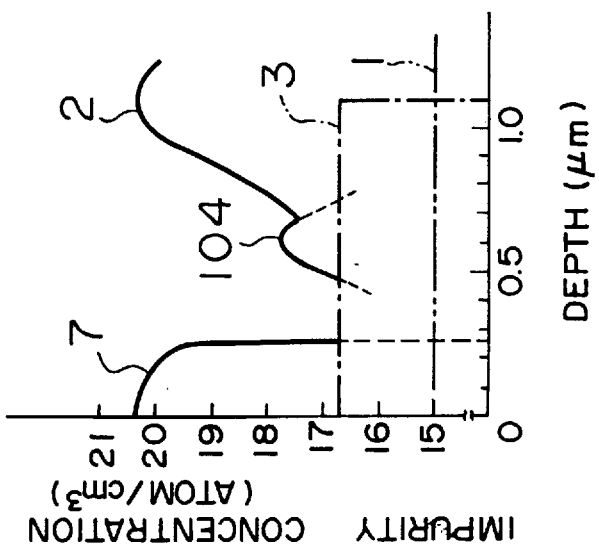
FIGS. 4A to 4C are graphs showing the impurity concentration distribution in a pedestal collector region respectively taken along lines A—A, B—B, and C—C in FIG. 3.
Figure 4B:
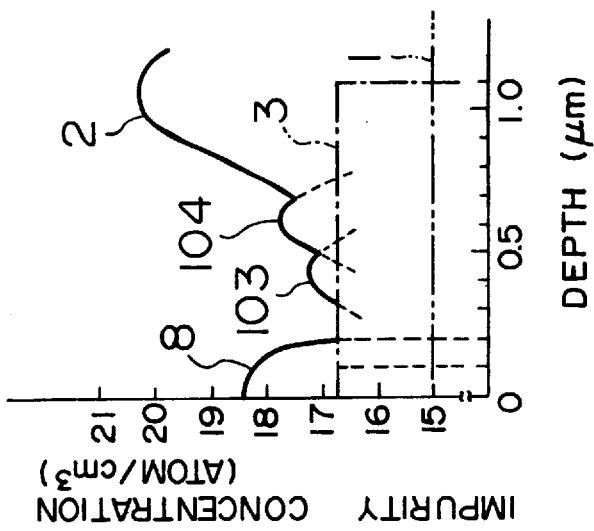
Figure 4C:
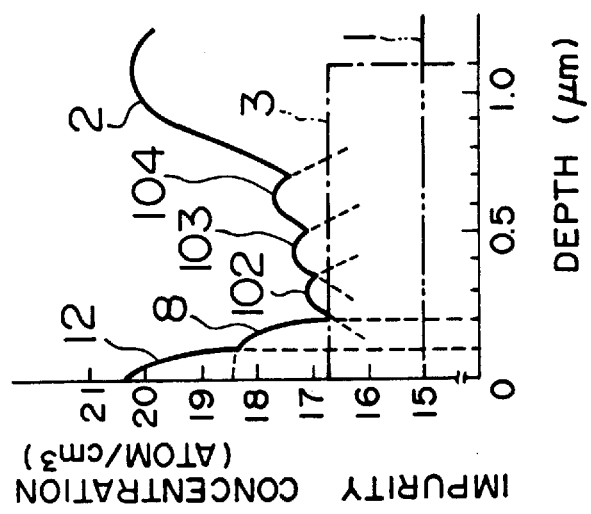

FIGS. 4A to 4C show the impurity concentration distribution of the pedestal collector regions 102, 103, and 104 in the direction of depth, in which FIG. 4A shows the impurity concentration distribution of a portion taken along the line A—A of FIG. 3, FIG. 4B shows the impurity concentration distribution of a portion taken along the line B—B of FIG. 3, and FIG. 4C shows the impurity concentration distribution of a portion taken along the line C—C of FIG. 3. In this manner, the impurity concentration changes in the pedestal collector regions 102, 103, and 104 in the direction of depth and among the respective pedestal collector regions. In FIGS. 4A to 4C, the impurity concentration in the ordinate is shown by logarithm.

Figure 5A:
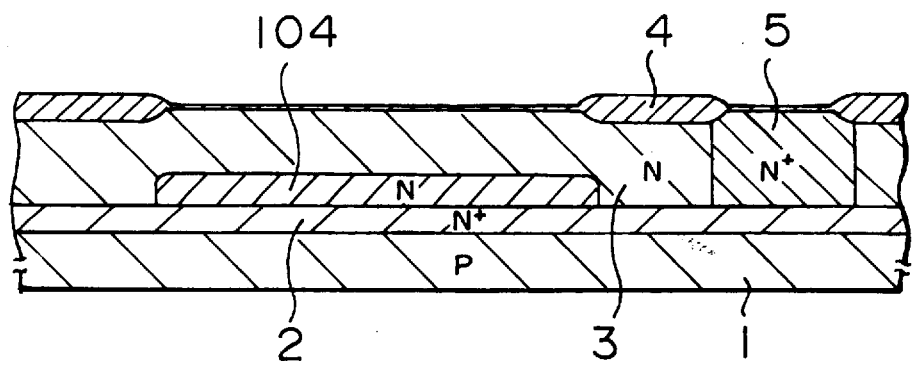
FIGS. 5A to 5D are longitudinal sectional views showing a manufacturing method according to the first embodiment in the order of steps.

A manufacturing method according to the first embodiment of the present invention described above will be described with reference to FIGS. 5A to 5D. As shown in FIG. 5A, an n-type buried layer 2 and an n-type epitaxial layer 3 are sequentially formed on the entire surface of a p-type semiconductor substrate 1. Subsequently, an isolation oxide film 4 having a thickness of 300 nm to 600 nm is selectively formed on the resultant structure in accordance with the ordinary method. By employing ion implantation, a collector contact diffusion layer 5 is formed to reach the n-type buried layer 2. Phosphorus is ion-implanted at a depth of about 0.5 to 0.6 $\mu$m (a projected range Rp of ion implantation) in a transistor formation region with an energy of 500 to 600 keV and at $1\times10^{12}$ to $1\times10^{13}$ cm$^{-2}$, so that a first pedestal collector region 104 is selectively formed.

Figure 5B:
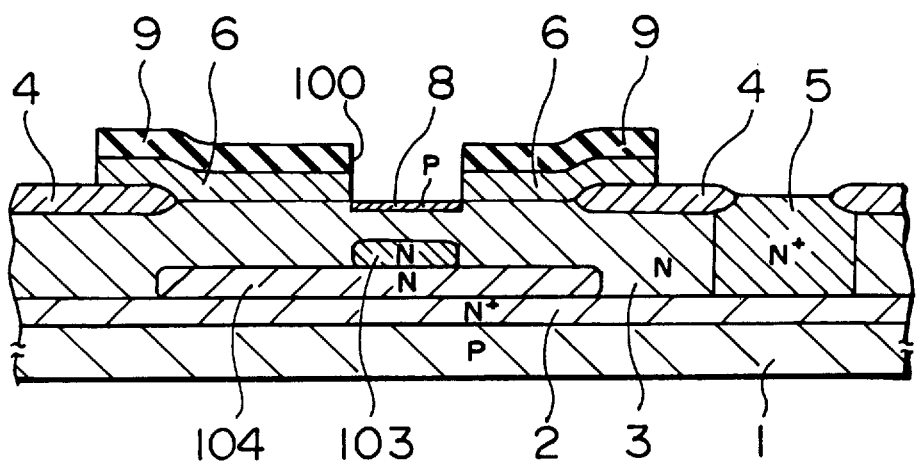

Subsequently, as shown in FIG. 5B, an oxide film 13 on the active base region is removed in accordance with known photoetching, and a p-type polycrystalline silicon film 6 containing boron and having a thickness of 100 nm to 300 nm is formed. Boron is doped in the polycrystalline silicon film 6 in accordance with, e.g., ion implantation with an energy of 5 to 10 kev and at $5\times10^{15}$ to $1\times10^{16}$ cm$^{-2}$. Boron may be doped while forming the polycrystalline silicon layer. A nitride film 9 is formed to have a thickness of 100 nm to 200 nm in accordance with the known LPCVD method. The resultant structure is patterned to a predetermined shape to form a base contact electrode 6 and an emitter opening portion 100.

Boron is ion-implanted in a region corresponding to the active base region with an energy of 10 keV and at $3\times10^{13}$ cm$^{-2}$ to form a p-type intrinsic base region 8. Subsequently, phosphorus is ion-implanted with an energy of 300 to 400 keV and at $1\times10^{12}$ to $1\times10^{13}$ cm$^{-2}$ through the emitter opening portion 100, thus forming a second pedestal collector region 103 having a thickness of about 0.4 to 0.5 $\mu$m (a projected range Rp of ion implantation) in the transistor formation region.

Figure 5C:
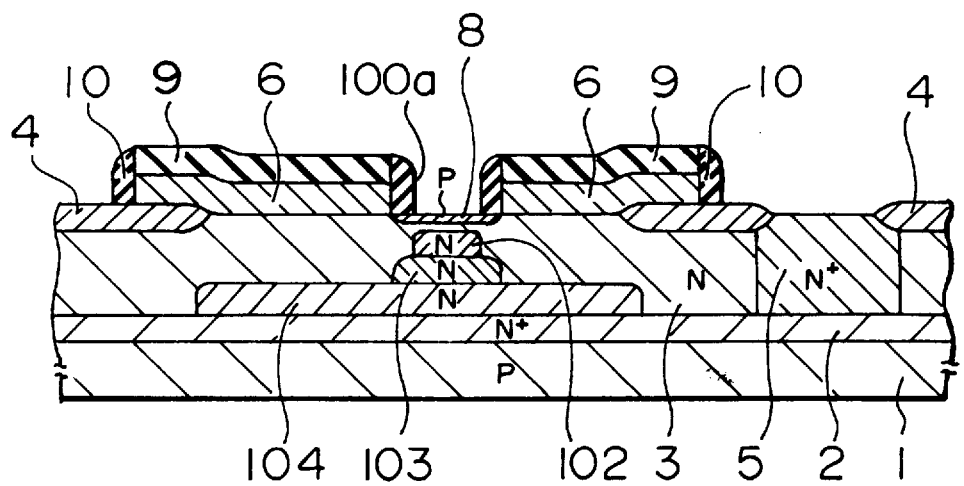

As shown in FIG. 5C, a side wall insulating film 10 having a thickness of 100 nm to 300 nm is formed on the side surface of the base contact electrode 6. This formation is performed in accordance with, e.g., a known etching-back technique after a nitride film is formed. Phosphorus is ion-implanted with an energy of 200 to 250 keV and at $1\times10^{12}$ to $1\times10^{13}$ cm$^{-2}$ through an emitter opening portion 100a, so that a third pedestal collector region 102 is formed at a depth of about 0.25 to 0.35 $\mu$m (a projected range Rp of ion implantation) in the transistor formation region.

Figure 5D:
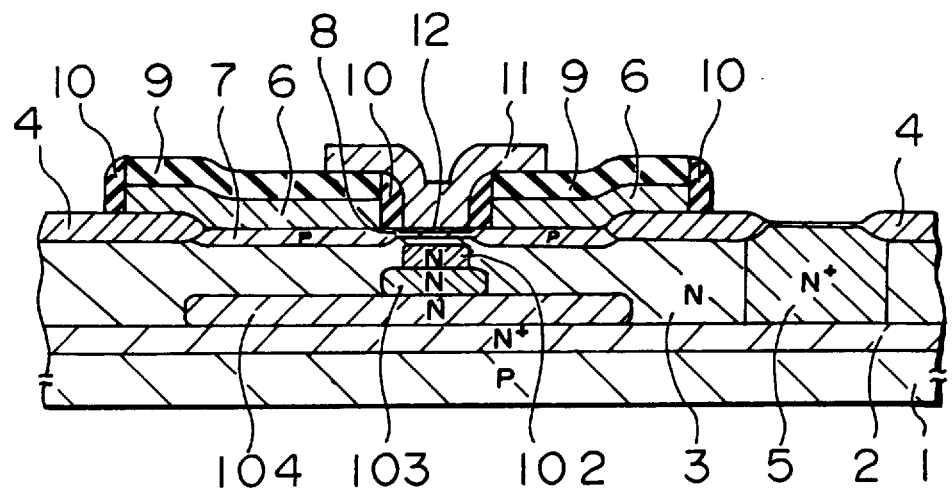

As shown in FIG. 5D, a polycrystalline silicon layer containing an n-type impurity, e.g., arsenic, and having a thickness of 200 nm to 300 nm is formed, and the resultant structure is selectively etched to form an emitter contact electrode 11. The resultant structure is annealed in a nitrogen atmosphere of 900° to 950° C. for 10 minutes, so that arsenic contained in the emitter contact electrode 11 diffuses into the p-type intrinsic base region 8, thus forming an n-type emitter region 12. At this time, boron contained in the p-type polycrystalline silicon film 6 diffuses into the epitaxial layer 3 simultaneously to form a p-type external base region 7. Thereafter, although not shown, an insulating interlayer film, an electrode, and the like are formed in accordance with an ordinary method, thus completing a bipolar transistor.

Figure 6:
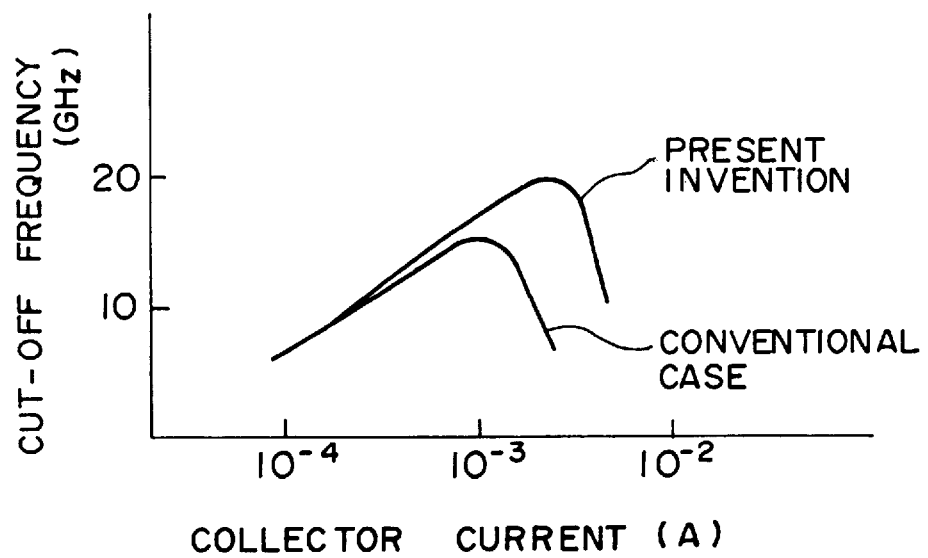
FIG. 6 is a graph showing the effect of suppressing the Kirk effect in the first embodiment in comparison with that in the conventional example.

In the bipolar transistor shown in FIG. 3 which is manufactured in this manner, the impurity concentrations and areas of the first, second, and third pedestal collector regions 102, 103, and 104 immediately under the emitter region 12 increase toward the inner portion of the substrate (as the depth is increased). Therefore, as shown in FIG. 6, the Kirk effect can be suppressed than in the conventional case without increasing the base-collector parasitic capacitance, and the cut-off frequency is not degraded even in a high-current injection region.

Figure 7:
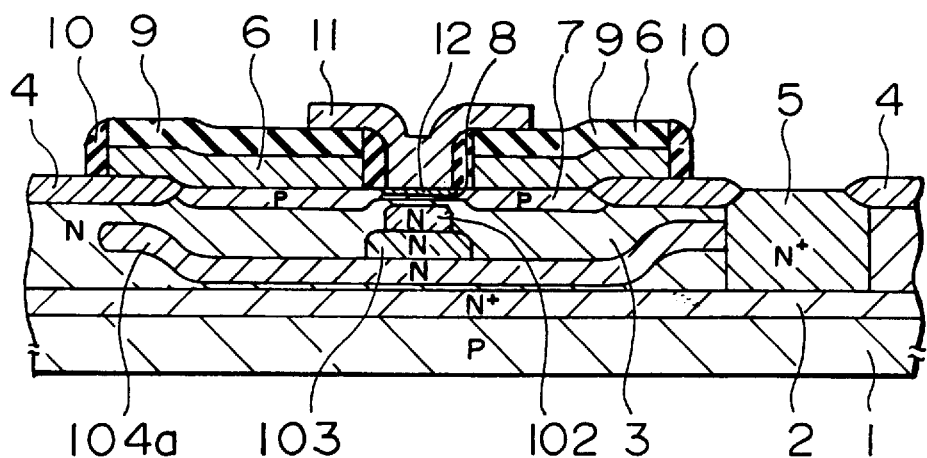
FIG. 7 is a longitudinal sectional view showing a modification of the first embodiment.

FIG. 7 is a longitudinal sectional view showing a modification of the first embodiment. In this modification, when selectively forming a first pedestal collector region 104a, a phosphorus ion implantation region is formed to be connected to a collector contact diffusion layer 5. At this time, a portion of the first pedestal collector region 104a where phosphorus ions are doped through an isolation oxide film 4 becomes shallower than the remaining portion. When the first pedestal collector region 104a is connected to the collector contact diffusion layer 5, the collector resistance can be decreased than in the first embodiment.

Figure 8:
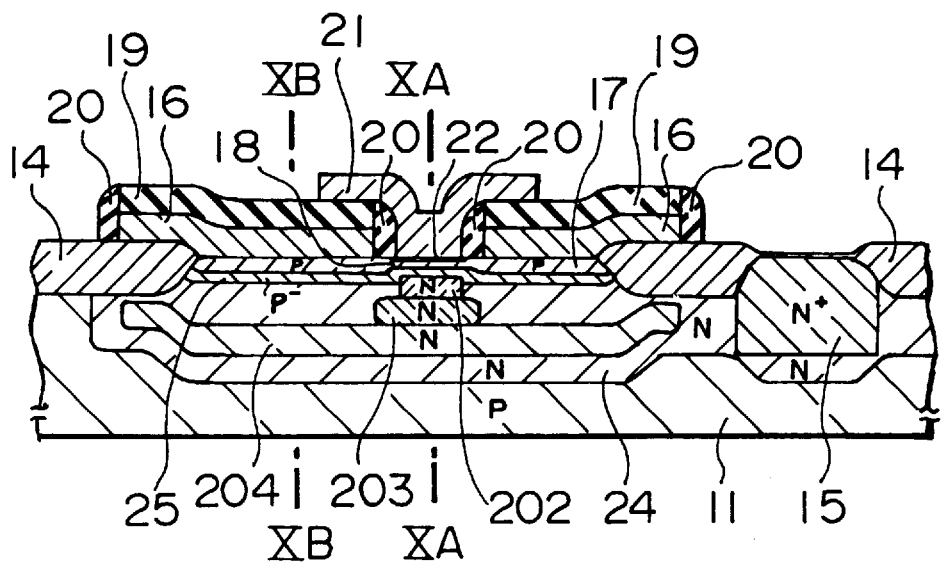
FIG. 8 is a longitudinal sectional view showing the second embodiment of the present invention.

The second embodiment of the present invention will be described. FIG. 8 is a sectional view of the second embodiment. The second embodiment is different from the first embodiment in the following respects. The surface of a substrate 1 is exposed and the implantation angle is set to 0°, to cause a channeling phenomenon. A p-type low-concentration region 25 is formed immediately under an external base region 17 and an intrinsic base region 18 more deeply with less concentration gradient than with ordinary 7° ion implantation, to be in contact with an external base region 17 and an intrinsic base region 18. With this technique, the base-collector junction capacitance can be decreased, and an increase in base resistance of the base region can be prevented.

Figure 9A:
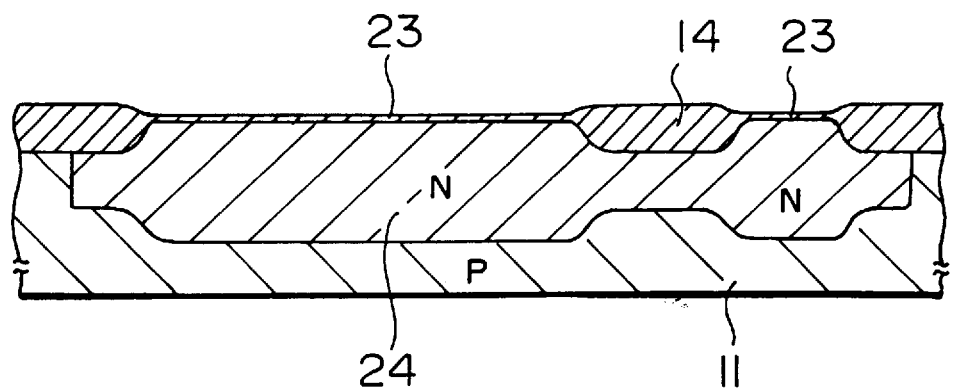
FIGS. 9A to 9F are longitudinal sectional views showing a manufacturing method according to the second embodiment in the order of steps.

A manufacturing method according to the second embodiment will be described. As shown in FIG. 9A, an isolation oxide film 14 having a thickness of 300 nm to 600 nm is selectively formed on a p-type semiconductor substrate 11 in accordance with the ordinary method. Subsequently, phosphorus is selectively ion-implanted with an energy of 1 to 1.5 MeV and at $1\times10^{13}$ to $1\times10^{14}$ cm$^{-2}$ by using a photoresist (not shown) as a mask, so that an N-well 24 serving as a collector layer is formed at a depth of about 1 to 2 μm (a projected range Rp of ion implantation) in a region at least including a transistor formation region. At this time, a portion of the N-well 24 where the phosphorus ions are doped through the isolation oxide film 14 having a thickness of 300 to 600 nm becomes shallower than the remaining portion. Reference numeral 23 denotes an oxide film corresponding to the transistor formation region.

Figure 9B:
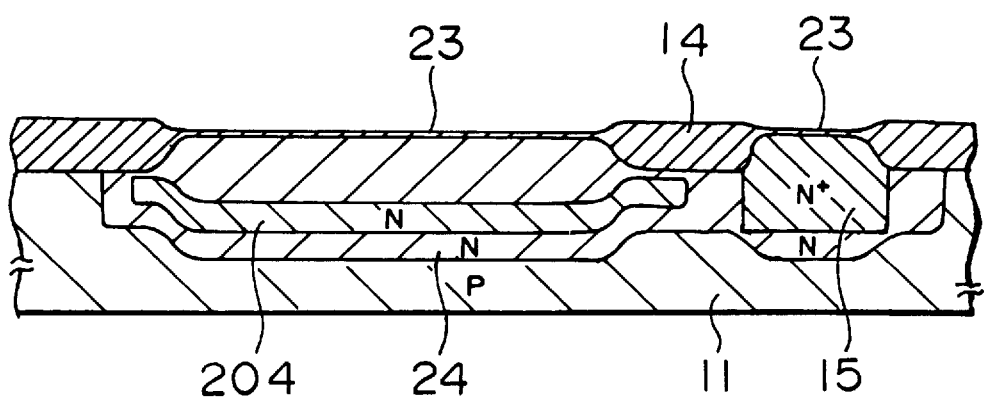

As shown in FIG. 9B, an n-type impurity, e.g., phosphorus, is doped into the substrate 11 in accordance with ion implantation, and the resultant structure is annealed in an inert gas, thus forming an n-type collector contact diffusion layer 15. Phosphorus is selectively ion-implanted with an energy of 500 to 600 keV and at $1\times10^{12}$ to $1\times10^{13}$ cm$^{-2}$ by using a photoresist (not shown) as a mask, so that a first pedestal collector region 204 is formed at a depth of about 0.5 to 0.6 μm (projected range Rp of ion implantation) in the transistor formation region. The second embodiment is different from the first embodiment in that the phosphorus implantation region is formed widely to extend to a portion below the isolation oxide film 14, as shown in FIG. 9B. With this structure, a sufficiently high dielectric break-down voltage (the punch-through breakdown voltage between the external base region 17 formed in the subsequent step and the substrate 11) can be obtained.

Figure 9C:
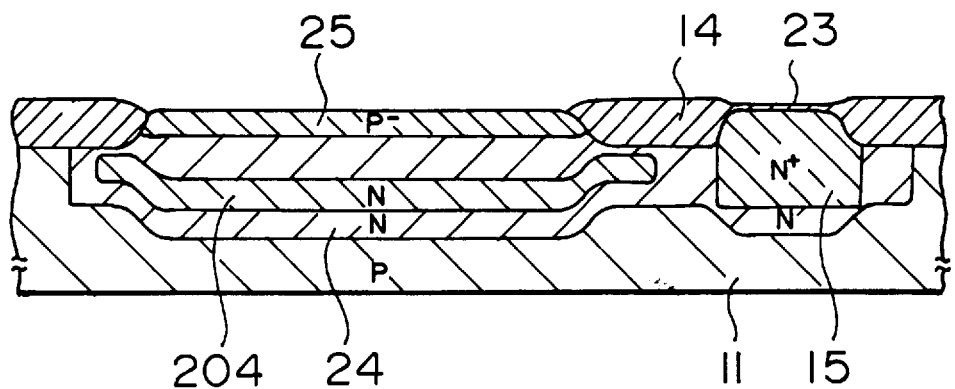

As shown in FIG. 9C, boron is ion-implanted in the transistor formation region with an energy of 10 to 50 kev and at $5\times10^{11}$ to $1\times10^{13}$ cm$^{-2}$ to form a p-type low-concentration region 25. In this ion implantation, it is preferable that the oxide film on the transistor formation region 23 be removed in accordance with known photoetching, and thereafter boron be ion-implanted with an energy of 10 to 50 keV and at $5\times10^{11}$ to $1\times10^{13}$ cm$^{-2}$ with an ion implanting angle of 0° (to be perpendicular to the substrate surface), not 7° which is an ordinary angle. This is because of the following reason. Since the surface of the silicon (100) substrate 11 is exposed and the implantation angle is set to 0°, a channeling phenomenon is caused. Then, the p-type low-concentration region 25 is formed more deeply with less concentration gradient than in ordinary 7-degree ion implantation, so that a p-type low-concentration region 25 uniform in the direction of depth can be formed.

Figure 9D:
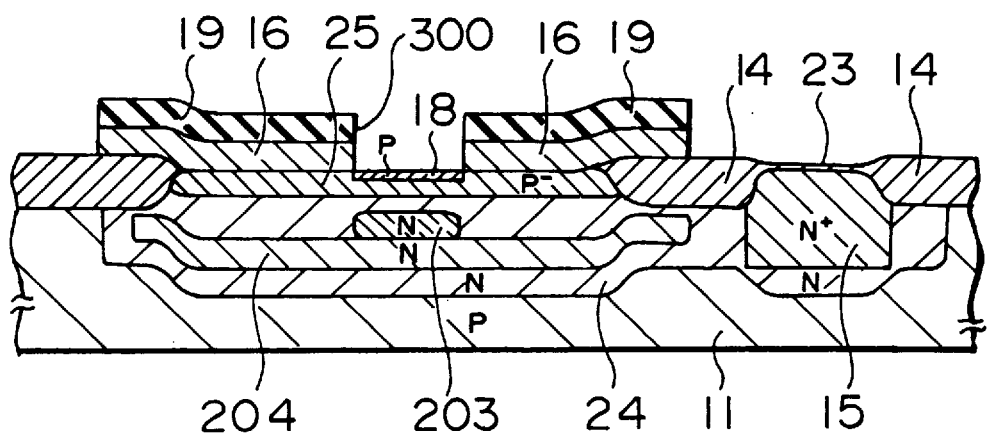

As shown in FIG. 9D, the oxide film 23 on the transistor formation region is removed, and a p-type polycrystalline silicon film 16 containing boron and having a thickness of 100 nm to 300 nm is formed on the entire surface of the substrate 11 including a region where the surface of the substrate is exposed. For example, boron is doped in the polycrystalline silicon film 16 in accordance with ion implantation with an energy of 5 to 10 keV and at $5\times10^{15}$ to $1\times10^{16}$ cm$^{-2}$. Boron may be doped during formation of the polycrystalline silicon film 16. Subsequently, a nitride film 19 having a thickness of 100 nm to 200 nm is formed by using the known LPCVD method. The resultant structure is patterned into a predetermined shape to form a base contact electrode 16, and an emitter opening portion 300 is formed in the base contact electrode 16. Subsequently, boron is ion-implanted in the active base region with an energy of 10 keV and at $5\times10^{12}$ cm$^{-2}$ to form the p-type intrinsic base region 8. Phosphorus is ion-implanted with an energy of 300 to 400 keV and at $1\times10^{12}$ to $1\times10^{13}$ nm$^{-2}$ through the emitter opening portion 300 to form a second pedestal collector region 203 at a depth of about 0.4 to 0.5 μm (a projected range Rp of ion implantation) in the transistor formation region.

Figure 9E:
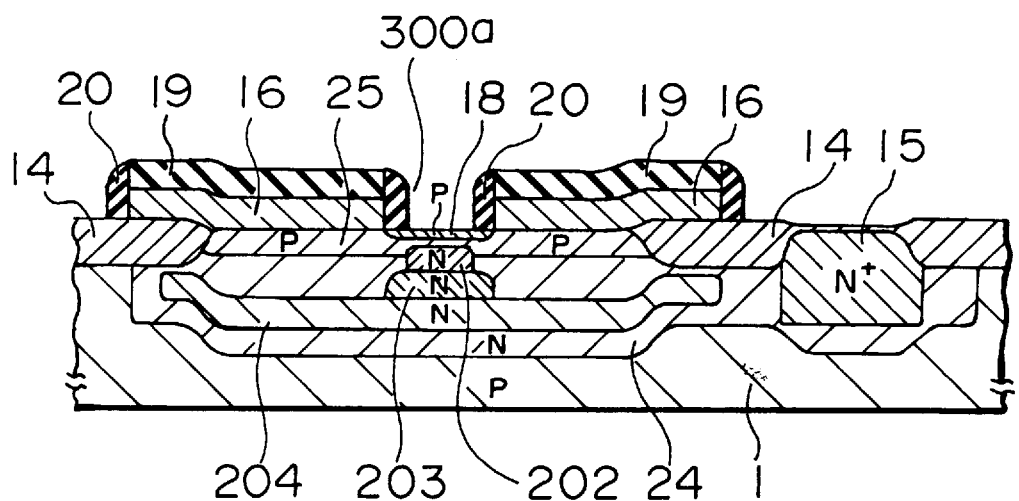

As shown in FIG. 9E, a side wall insulating film, e.g., a nitride film 20, having a thickness of about 100 nm to 300 nm is formed on the side surface of the base contact electrode 16 in accordance with a known technique. Phosphorus is ion-implanted with an energy of 200 to 250 keV and at $1\times10^{12}$ to $1\times10^{13}$ nm$^{-2}$ through an emitter opening portion 300a, so that a third pedestal collector region 202 is formed at a depth of about 0.25 to 0.35 μm (a projected range Rp of ion implantation) in the transistor formation region.

Figure 9F:
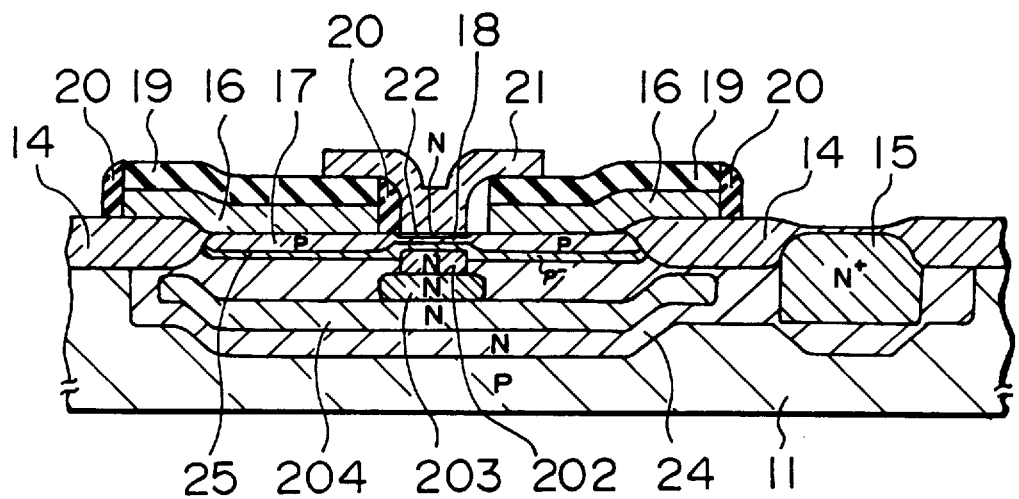

As shown in FIG. 9F, a polycrystalline silicon layer containing an n-type impurity, e.g., arsenic, and having a thickness of 200 nm to 300 nm is formed to form an emitter contact electrode 21. The resultant structure is thermally treated in a nitrogen atmosphere of 900° to 950° C. for 10 minutes, so that arsenic contained in the emitter contact electrode 21 diffuses into the p-type intrinsic base region 18, thus forming an emitter region 22. At this time, boron contained in the p-type polycrystalline silicon film 16 diffuses into the low-concentration region 25 simultaneously to form an external base region 17. Thereafter, although not shown, an insulating interlayer film, an electrode, and the like are formed in accordance with a known method, thus completing a bipolar transistor.

Figure 11B:
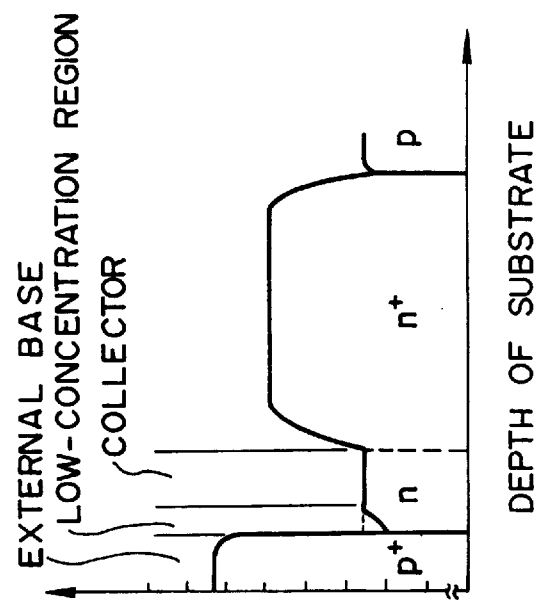
FIGS. 11A and 11B are graphs showing the impurity concentration distribution of a conventional example employed as a comparative example.
Figure 11A:
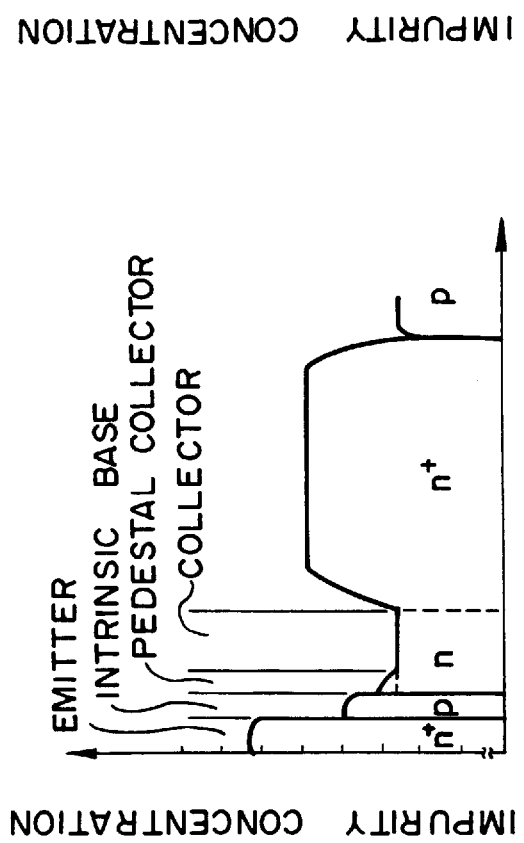

FIGS. 10A and 10B show the impurity concentration distribution in the direction of depth of the pedestal collector according to the second embodiment shown in FIG. 8 respectively along the lines XA—XA and XB—XB therein. In FIGS. 10A and 10B, the impurity concentration in the ordinate is shown by logarithm. In contrast to these impurity concentration distributions, Japanese Unexamined Patent Publication No. 4-51526 employed as a comparative example describes a technique for lowering the concentration of the n-type impurity in a region extending from the surface of a collector layer to a depth of 0.5 μm to $1\times10^{16}$/cm$^3$ (a technique for not inverting this region to a p-type region), as shown in FIGS. 11B, by performing compensation ion implantation of a p-type impurity, e.g., boron, to an n-type collector layer by using an isolation oxide film as a mask. FIGS. 11A and 11B show the impurity concentration distributions of a section of the intrinsic base region and of a section of the external base region of this comparative example. However, it is difficult to form such a compensated low-concentration region having a concentration of $1\times10^{16}$/cm$^3$ or less by compensating ion implantation in the interface of the external base diffusion layer and the collector at high precision. Meanwhile, with the method of forming a p-type low-concentration region having an impurity concentration distribution as in the second embodiment shown in FIGS. 10A and 10B, such a low-concentration region can be realized comparatively easily, although the depletion layer extends less than with the method of compensating the impurity.

According to the second embodiment, when the p-type low-concentration region 25 is formed by ion implantation at an angle of 0°, the parasitic capacitance can be further decreased than in the first embodiment by 5 to 10%. Also, since the p-type region of the link base region located between the external base region 17 and the intrinsic base region 18 is not compensated for by the n-type impurity which is doped in order to form the pedestal collector region, the base resistance does not increase unlike in the conventional ease but can be decreased by about 5 to 10%.

Figure 12:
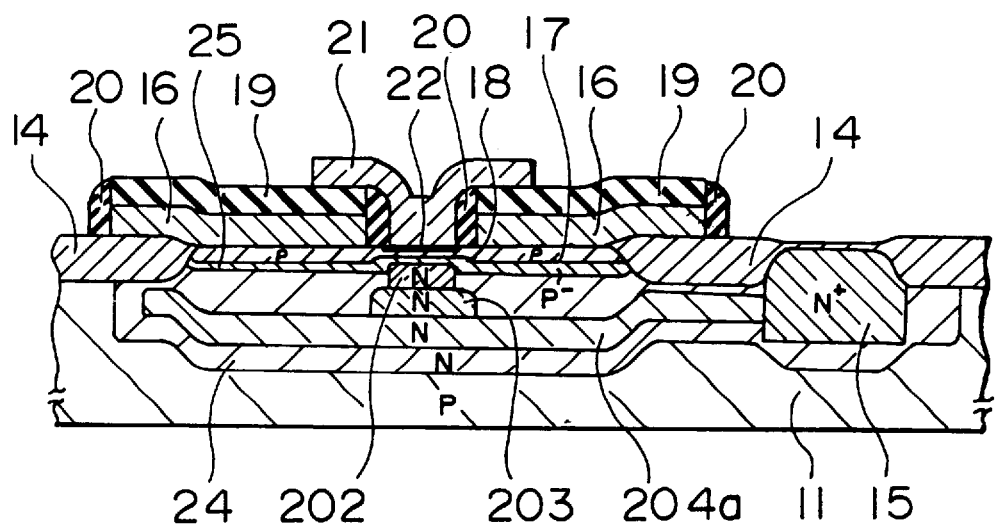
FIG. 12 is a longitudinal sectional view showing a modification of the second embodiment.

FIG. 12 is a longitudinal sectional view showing a modification of the second embodiment. In the second embodiment, the deep N-well 24 is formed at a depth of about 1 to 2 μm (a projected range Rp of ion implantation) in a region including a transistor formation region by phosphorus ion implantation under conditions of, e.g., 1 to 1.5 MeV and $1 \times 10^{13}$ to $1 \times 10^{14}$ cm$^{-2}$. This implantation amount is preferably set to $1 \times 10^{14}$ cm$^{-2}$ or less. If the ion implantation amount is suppressed to this value or less, the collector resistance of the bipolar transistor undesirably increases.

In order to solve this drawback, in the modification shown in FIG. 12, when selectively forming a first pedestal collector region 204a, a phosphorus ion implantation region is formed to be connected to an n-type collector contact diffusion layer 15. For example, this first pedestal collector region 204a is formed at a depth of about 0.4 to 0.5 μm (a projected range Rp of ion implantation) in the transistor formation region with a phosphorus ion implantation energy of 300 to 400 keV and at $1 \times 10^{12}$ to $1 \times 10^{14}$ cm$^{-2}$. At this time, a portion of the first pedestal collector region 204a where phosphorus is doped through an isolation oxide film 14 having a thickness of 300 to 600 nm becomes shallower than the remaining portion. In this manner, when the first pedestal collector region 204a is connected to the collector contact diffusion layer 15, the collector resistance can be decreased by about 5 to 30% when compared to the second embodiment.

It is to be understood that the present invention is not limited to the embodiments described above, but the conductivity type, the impurity to be ion-implanted, and the like can be designed arbitrarily while achieving the same effect as in the above embodiments.

What is claimed is:

1. A semiconductor device comprising an epitaxial layer of one conductivity type formed on a semiconductor substrate of the other conductivity type, a base region of the other conductivity type formed on the epitaxial layer to extend from a surface of the epitaxial layer to a predetermined depth, an emitter region of the one conductivity type formed in the base region, and a plurality of more than two pedestal collector reqions of the one conductivity type formed in a portion of the epitaxial layer which is immediately under the base region.

2. A semiconductor device according to claim 1, wherein the pedestal collector region comprises a first pedestal collector region formed at a deepest portion in the epitaxial layer, having a highest impurity concentration, and extending for a comparatively wide range, a second pedestal collector region formed at a position in the epitaxial layer which is shallower than the first pedestal collector region, having an impurity concentration lower than that of the first pedestal collector region, and extending for a range smaller than that of the first pedestal collector region, and a third pedestal collector region formed at a position in the epitaxial layer which is shallower than the second pedestal collector region, having an impurity concentration lower than that of the second pedestal collector region, and extending for a range smaller than that of the second pedestal collector region.

3. A semiconductor device according to claim 2, further comprising a region of the other conductivity type which is formed on a portion of the epitaxial layer immediately under the base region to correspond thereto so as to be in contact with the base region and which has an impurity concentration lower than that of the base region.

4. A semiconductor device according to claim 2, further comprising a collector buried layer formed under the epitaxial layer and a collector contact diffusion layer formed in the epitaxial layer to be in contact with the collector buried layer, wherein the first pedestal collector region is in contact with the collector contact diffusion layer with part of a periphery thereof.

5. A semiconductor device according to claim 3, further comprising a collector buried layer formed under the epitaxial layer and a collector contact diffusion layer formed in the epitaxial layer to be in contact with the collector buried layer, wherein the first pedestal collector region is in contact with the collector contact diffusion layer with part of a periphery thereof.

6. A semiconductor device according to claim 1, wherein said plurality of pedestal collector regions includes a first pedestal collector region at a lower depth of the epitaxial layer, a second pedestal collector region formed at a depth of the epitaxial layer which is shallower than the first pedestal collector region, and a third pedestal collector region formed at a position in the epitaxial layer which is shallower than the second pedestal collector region.

7. A semiconductor device according to claim 6, wherein said first pedestal collector region has a highest impurity concentration, said second pedestal collector region has a lower impurity concentration lower than that of the first pedestal collector region, and said third pedestal collector region has a lower impurity concentration than that of the second pedestal collector region.

8. A semiconductor device according to claim 7, whereby base resistance and base-collector capacitance are decreased so as to greatly improve an operation speed of said semiconductor device by increasing cut-off frequency.

9. A semiconductor device according to claim 8, wherein said plurality of pedestal collector regions are consecutive.

10. A semiconductor device according to claim 9, wherein said first pedestal collector region is wider than said second pedestal collector region and said second pedestal collector region is wider than said third pedestal collector region.

11. A semiconductor device according to claim 10, wherein the impurity concentration of said first pedestal collector region is approximately $6 \times 10^{17}$ atoms/cm$^3$ having been formed using ion implantation with an energy of 500 to 600 keV and a dose of $1 \times 10^{12}$ to $1 \times 10^{13}$ cm$^{-2}$, the impurity concentration of said second pedestal collector region is approximately $4 \times 10^{17}$ atoms/cm$^3$ having been formed using ion implantation with an energy of 300 to 400 keV and a dose of $1 \times 10^{12}$ to $1 \times 10^{13}$ cm$^{-2}$, and the impurity concentration of said third pedestal collector region is approximately $2 \times 10^{17}$ atoms/cm$^3$ having been formed using ion implantation with an energy of 200 to 250 keV and a dose of $1 \times 10^{12}$ to $1 \times 10^{13}$ cm$^{-2}$.

12. A semiconductor device according to claim 11, wherein the depth of said first pedestal collector region is about 0.5 μm to 0.6 μm, the depth of said second pedestal collector region is about 0.4 μm to 0.5 μm, and the depth of said third pedestal collector region is about 0.25 μm to 0.35 μm.

13. A semiconductor device according to claim 12, further comprising a collector contact diffusion layer connected to said first pedestal collector region.

14. A semiconductor device according to claim 12, further comprising a region of the other conductivity type which is formed on a portion of the epitaxial layer immediately under the base region to correspond thereto so as to be in contact with the base region and which has an impurity concentration lower than that of the base region.

15. A semiconductor device according to claim 12, further comprising a collector buried layer formed under said epitaxial layer and a collector contact diffusion layer formed in said epitaxial layer to be in contact with said collector buried layer, wherein said first pedestal collector region is in contact with the collector contact diffusion layer with part of a periphery thereof.

16. A semiconductor device according to claim 14, further comprising a collector buried layer formed under said epitaxial layer and a collector contact diffusion layer formed in said epitaxial layer to be in contact with said collector buried layer, wherein said first pedestal collector region is in contact with the collector contact diffusion layer with part of a periphery thereof.

17. A semiconductor bipolar transistor, comprising:

an epitaxial layer of one conductivity type;

a base region of an other conductivity type formed on said epitaxial layer;

an emitter region of the one conductivity type formed in said base region; and a plurality of pedestal collector regions of the one conductivity type formed in a portion of the epitaxial layer which is under the base region, having at least two of said plurality of pedestal collector regions being connected in contact with one another.

18. A semiconductor bipolar transistor according to claim 17, wherein said plurality of pedestal collector regions includes a first pedestal collector region at a lower depth of the epitaxial layer, a second pedestal collector region formed at a depth of the epitaxial layer which is shallower than the first pedestal collector region, and a third pedestal collector region formed at a position in the epitaxial layer which is shallower than the second pedestal collector region.

19. A semiconductor bipolar transistor according to claim 18, wherein said first pedestal collector region has a highest impurity concentration, said second pedestal collector region has a lower impurity concentration lower than that of the first pedestal collector region, and said third pedestal collector region has a lower impurity concentration than that of the second pedestal collector region.

20. A semiconductor bipolar transistor according to claim 19, whereby base resistance and base-collector capacitance are decreased so as to greatly improve an operation speed of said semiconductor bipolar transistor by increasing cut-off frequency.

21. A semiconductor device according to claim 20, wherein the impurity concentration of said first pedestal collector region is approximately $6 \times 10^{17}$ atoms/cm$^3$ having been formed using ion implantation with an energy of 500 to 600 keV and a dose of $1 \times 10^{12}$ to $1 \times 10^{13}$ cm$^{-2}$, the impurity concentration of said second pedestal collector region is approximately $4 \times 10^{17}$ atoms/cm$^3$ having been formed using ion implantation with an energy of 300 to 400 keV and a dose of $1 \times 10^{12}$ to $1 \times 10^{13}$ cm$^{-2}$, and the impurity concentration of said third pedestal collector region is approximately $2 \times 10^{17}$ atoms/cm$^3$ having been formed using ion implantation with an energy of 200 to 250 keV and a dose of $1 \times 10^{12}$ to $1 \times 10^{13}$ cm$^{-2}$.

22. A semiconductor device according to claim 21, wherein the depth of said first pedestal collector region is about 0.5 μm to 0.6 μm, the depth of said second pedestal collector region is about 0.4 μm to 0.5 μm, and the depth of said third pedestal collector region is about 0.25 μm to 0.35 μm.

* * * * *